US011492249B2

(12) United States Patent
Tumpold et al.

(10) Patent No.: US 11,492,249 B2
(45) Date of Patent: Nov. 8, 2022

(54) MEMS SENSOR, MEMS SENSOR SYSTEM AND METHOD FOR PRODUCING A MEMS SENSOR SYSTEM

(71) Applicant: Infineon Technologies AG, Neubiberg (DE)

(72) Inventors: David Tumpold, Kirchheim b Muenchen (DE); Dominic Maier, Pleystein (DE)

(73) Assignee: INFINEON TECHNOLOGIES AG, Neubiberg (DE)

(*) Notice: Subject to any disclaimer, the term of this patent is extended or adjusted under 35 U.S.C. 154(b) by 822 days.

(21) Appl. No.: 16/400,365

(22) Filed: May 1, 2019

(65) Prior Publication Data
US 2019/0352175 A1 Nov. 21, 2019

(30) Foreign Application Priority Data
May 16, 2018 (DE) .......................... 102018207605.7

(51) Int. Cl.
*B81B 7/00* (2006.01)
*G01N 29/24* (2006.01)
(Continued)

(52) U.S. Cl.
CPC ........ *B81B 7/0061* (2013.01); *B81C 1/00309* (2013.01); *G01N 29/2425* (2013.01); *H04R 19/005* (2013.01); *H04R 19/04* (2013.01); *B81B 2201/0214* (2013.01); *B81B 2201/0257* (2013.01); *B81B 2203/0127* (2013.01); *B81B 2207/012* (2013.01); *G01N 2291/021* (2013.01); *H04R 2201/003* (2013.01)

(58) Field of Classification Search
CPC .......... B81B 7/0061; B81B 2201/0214; B81B 2201/0257; B81B 2203/0127; B81B 2207/012; B81C 1/00309; G01N 29/2425; G01N 2291/021; H04R 19/005; H04R 19/04; H04R 2201/003
USPC .......................................................... 73/643
See application file for complete search history.

(56) References Cited

U.S. PATENT DOCUMENTS 9,961,464 B2 * 5/2018 Porter .................. H04R 29/001
2002/0106828 A1 8/2002 Loeppert
(Continued)

FOREIGN PATENT DOCUMENTS

DE 10303263 A1 8/2004
DE 102004011149 B3 11/2005
(Continued)

*Primary Examiner* — Tu-Tu V Ho
(74) *Attorney, Agent, or Firm* — Slater Matsil, LLP

(57) ABSTRACT

A MEMS sensor includes a sensor package and a membrane arranged in the sensor package, wherein a first partial volume of the sensor package adjoins a first main side of the membrane and a second partial volume of the sensor package adjoins a second main side of the membrane, wherein the second main side is arranged opposite the first main side. The MEMS sensor includes a first opening in the sensor package, said first opening connecting the first partial volume to an external environment of the sensor package in an acoustically transparent fashion. The MEMS sensor includes a second opening in the sensor package, said second opening connecting the second partial volume to the external environment of the sensor package in an acoustically transparent fashion.

25 Claims, 12 Drawing Sheets

(51) Int. Cl.
  *B81C 1/00*   (2006.01)
  *H04R 19/04*   (2006.01)
  *H04R 19/00*   (2006.01)

(56) References Cited

U.S. PATENT DOCUMENTS

| | | |
|---|---|---|
| 2005/0207605 A1 | 9/2005 | Dehe et al. |
| 2008/0070158 A1 | 3/2008 | Sasaki et al. |
| 2008/0267431 A1 | 10/2008 | Leidl et al. |
| 2009/0074222 A1 | 3/2009 | Song |
| 2011/0195745 A1 | 8/2011 | Inoda et al. |
| 2015/0256940 A1 | 9/2015 | Dehe et al. |
| 2016/0044409 A1 | 2/2016 | Harney et al. |
| 2016/0157011 A1 | 6/2016 | Yoo |
| 2018/0070158 A1 | 3/2018 | Watson et al. |
| 2018/0091910 A1* | 3/2018 | Porter .................. H04R 29/001 |

FOREIGN PATENT DOCUMENTS

| | | |
|---|---|---|
| DE | 102015103321 A1 | 9/2015 |
| EP | 2194730 A2 | 6/2010 |
| EP | 2552124 A1 | 1/2013 |

\* cited by examiner

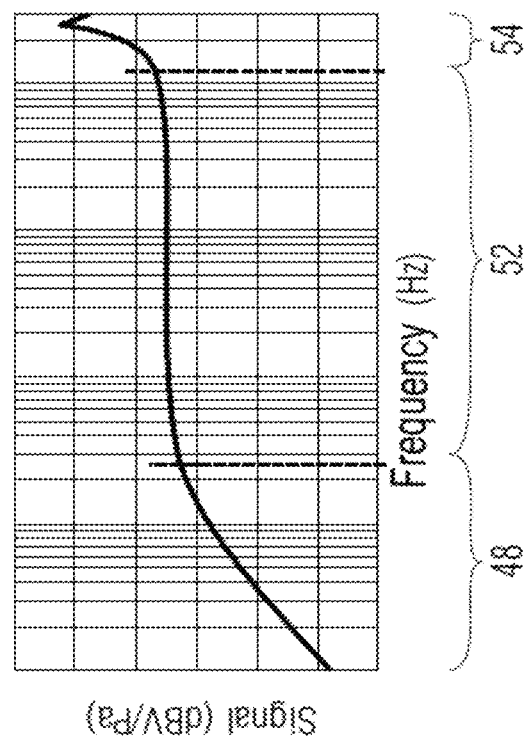
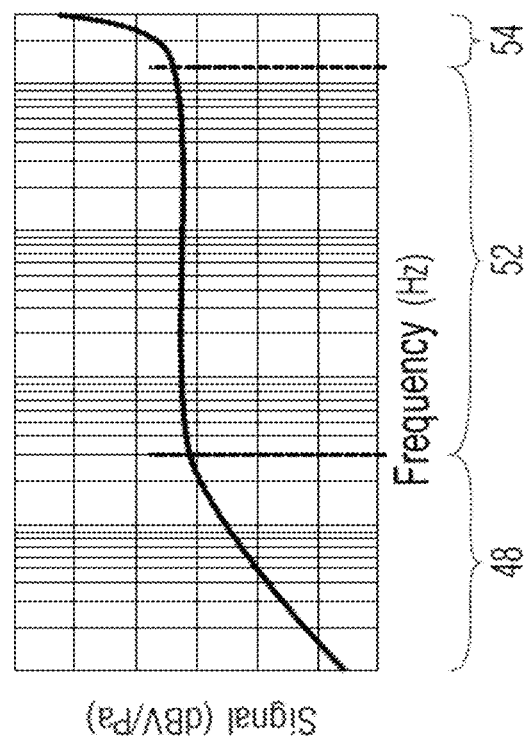

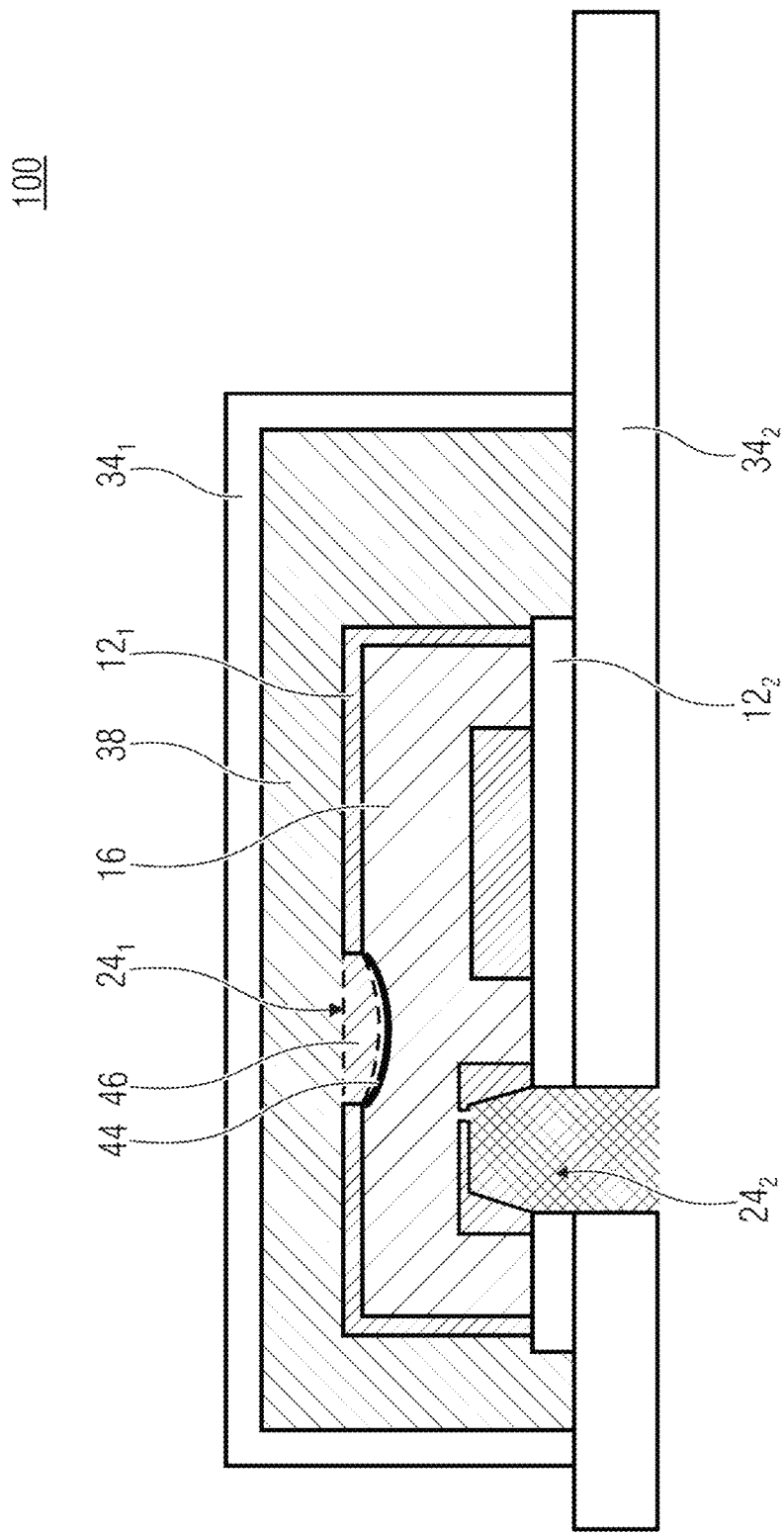

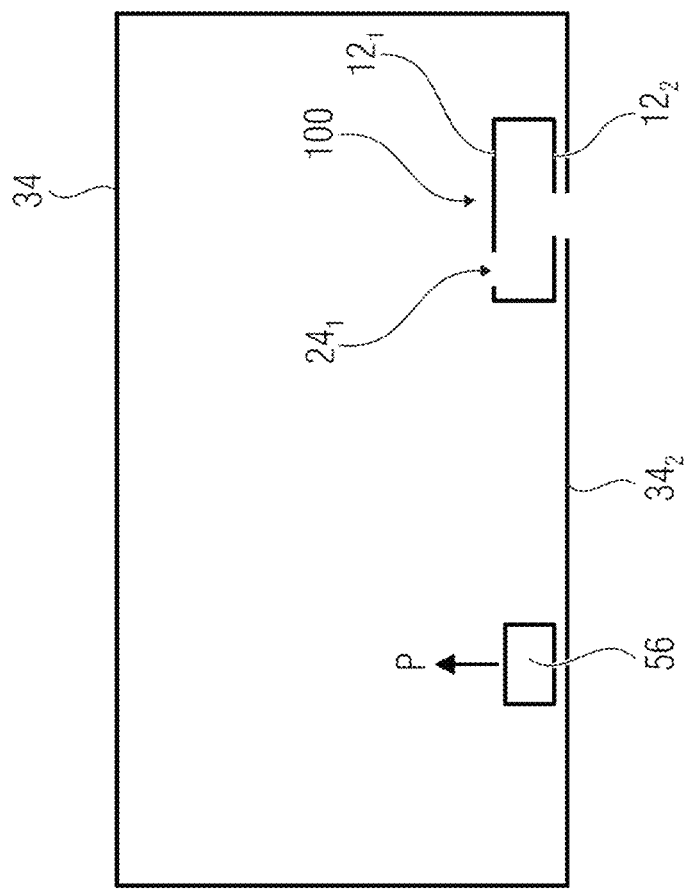

1200

1210 — Arranging a membrane in a system volume of a MEMS sensor system, such that the membrane is arranged between a first partial volume of the MEMS sensor system and a second partial volume of the MEMS sensor system, wherein the second partial volume is configured such that a frequency response of the membrane responding to a pressure change in a system environment that is fluidically coupled to the first partial volume is adapted to a target specification.

Fig. 12

MEMS SENSOR, MEMS SENSOR SYSTEM AND METHOD FOR PRODUCING A MEMS SENSOR SYSTEM

This application claims the benefit of German Application No. 102018207605.7, filed on May 16, 2018, which application is hereby incorporated herein by reference.

TECHNICAL FIELD

The present disclosure relates to a MEMS sensor, for example a MEMS microphone or a pressure sensor, to a MEMS sensor system and to a method for providing a MEMS sensor system. The present disclosure furthermore relates to a MEMS microphone comprising two sound entry openings (Dual Port Microphone).

BACKGROUND

Microelectromechanical systems (MEMS) comprising membranes can be produced using silicon technology and can have a functionality based on the deflection of the membrane. Examples of such MEMS are MEMS microphones and/or MEMS loudspeakers, which, on the basis of inverse operation, convert an electrical signal into a sound pressure (loudspeaker) or convert a variation in the sound pressure into an electrical signal (microphones). Pressure sensors are also based on the principle of converting a sound pressure into an electrical signal, and are likewise able to be embodied as MEMS.

MEMS sensors, MEMS sensor systems and a method for producing a MEMS sensor system which have a high diversity with respect to the device or systems in which the later MEMS sensor is used would be desirable.

SUMMARY

Exemplary embodiments provide a MEMS sensor comprising a sensor package and a membrane arranged in the sensor package, wherein a first partial volume of the sensor package adjoins a first main side of the membrane and a second partial volume of the sensor package adjoins a second main side of the membrane, wherein the second main side is arranged opposite the first main side. The MEMS sensor comprises a first opening in the sensor package, said first opening connecting the first partial volume to an external environment of the sensor package in an acoustic fashion. The MEMS sensor comprises a second opening in the sensor package, said second opening connecting the second partial volume to the external environment of the sensor package in an acoustic fashion. This makes it possible to use the MEMS sensor in different systems with an identical or comparable design of the individual components. In this regard, by way of example, a back volume can be configured differently in order to influence or to set the frequency response of the membrane, such that an identical MEMS module exhibits different properties in different systems (back volumes) and is therefore usable in a flexible manner.

In accordance with one exemplary embodiment, a MEMS sensor comprises a sensor package and a membrane arranged in the sensor package. A first partial volume of the sensor package adjoins a first main side of the membrane and a second partial volume of the sensor package adjoins a second main side of the membrane. The second main side is arranged opposite the first main side. A first opening in the sensor package connects the first partial volume to an external environment of the sensor package in an acoustically transparent fashion. A second opening in the sensor package adjoins the second partial volume. The MEMS sensor comprises an elastic element arranged in the second opening and configured to alter a content of the second partial volume on the basis of a fluid pressure in the external environment. This enables a setting of a pressure in the second partial volume by deflection of the flexible element and thus a setting of the frequency response of the membrane, such that this MEMS sensor is also usable in a flexible manner.

Exemplary embodiments provide a MEMS sensor system comprising a sensor package having a system volume. The MEMS sensor system comprises a MEMS sensor, wherein the system volume is coupled to the first partial volume either via the first opening or via the second opening, wherein the MEMS sensor is fluidically coupled to an environment of the MEMS sensor system via the other opening of the first and second openings. The system volume sets a resonant frequency of the membrane for fluid sound in the environment of the MEMS sensor system.

In accordance with one exemplary embodiment, a method for producing a MEMS sensor system comprises arranging a membrane in a system volume of a MEMS sensor system, such that the membrane is arranged between a first partial volume of the MEMS sensor system and a second partial volume of the MEMS sensor system. The second partial volume is configured such that a frequency response of the membrane responding to a pressure change in a system environment that is fluidically coupled to the first partial volume is adapted to a target specification.

BRIEF DESCRIPTION OF THE DRAWINGS

Exemplary embodiments are explained below with reference to the accompanying drawings, in which:

FIG. 9a shows a schematic frequency response of a bottom port microphone;

FIG. 9b shows a schematic frequency response of a MEMS sensor in accordance with one exemplary embodiment;

FIG. 10 shows a schematic lateral sectional view of a MEMS sensor in accordance with one exemplary embodiment described with an elastic element in an opening between a partial volume and a system volume;

FIG. 11 shows a schematic lateral sectional view of a MEMS sensor system in accordance with one exemplary embodiment, wherein the MEMS sensor from FIG. 10 is arranged in the system package; and FIG. 12 shows a schematic flow diagram of a method in accordance with one exemplary embodiment.

DETAILED DESCRIPTION OF ILLUSTRATIVE EMBODIMENTS

Before exemplary embodiments are more specifically explained in detail below with reference to the drawings, it is pointed out that identical, functionally identical or identically acting elements, objects and/or structures in the various figures are provided with the same reference signs, such that the description of these elements that is presented in the various exemplary embodiments is interchangeable or can be applied to one another.

Explanations below relate to MEMS sensors, to MEMS sensor systems and to a method for producing a MEMS sensor. In this case, the explanations below relate in particular to MEMS sensors and microelectromechanical systems in which the movement or deflection of a membrane is detected by an electrical signal and/or a movement or deflection of the membrane is excited on the basis of the electrical signal. Although the explanations below are directed to MEMS sensors, for instance microphones or pressure sensors, the specific configurations described in association therewith can also be applied to MEMS loudspeakers. As an alternative or in addition to the use as a sound transducer or microphone, the MEMS sensors can also be used as pressure sensors, for example as a differential pressure sensor, wherein different pressures act on the membrane 14 through the different openings (ports).

MEMS can be produced for example using silicon technology, for instance by providing or producing a layer stack comprising one or more semiconductors, wherein dopings thereof and/or the use of other materials such as electrically insulating materials and/or metallic materials are/is also possible.

Figure 1:
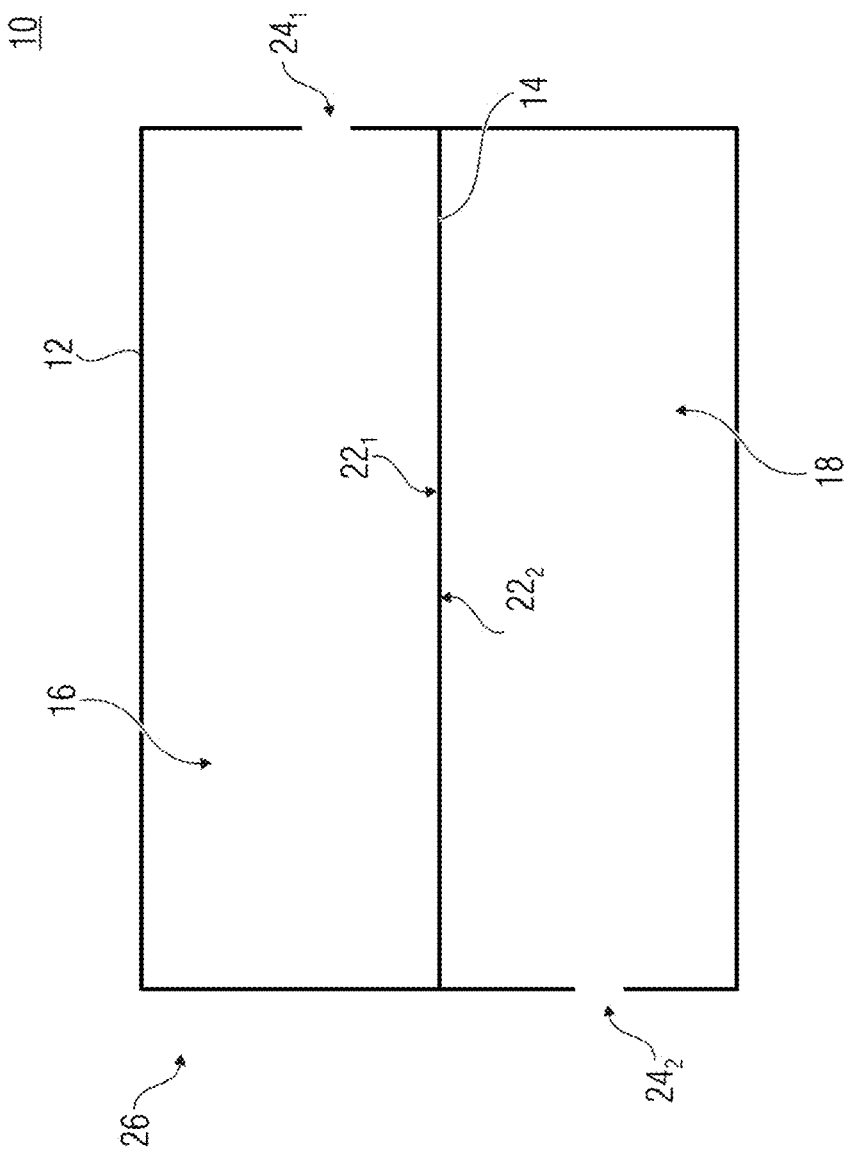
FIG. 1 shows a schematic lateral sectional view of a MEMS sensor in accordance with one exemplary embodiment.

FIG. 1 shows a schematic lateral sectional view of a MEMS sensor 10 in accordance with one exemplary embodiment. The MEMS sensor 10 comprises a sensor package 12, which can be formed in an integral or multipartite fashion and can comprise for example plastics materials, metallic materials and/or semiconductor materials. The MEMS sensor 10 comprises a membrane 14 which is arranged in the sensor package 12 and subdivides a volume located in the sensor package into a first partial volume 16 and a second partial volume 18. The first partial volume 16 adjoins a first main side 221 of the membrane, while the second partial volume 18 adjoins a second main side 222 of the membrane 14. The main sides 221 and 222 are arranged opposite one another and are formed for example by those surfaces which have the largest areal extent of the membrane. This may be, with no limiting effect, for example a top side and an underside of the membrane, for instance if the membrane 14 is arranged in a horizontal plane. If the membrane 14 is arranged for example in a vertical plane, then the main sides 221 and 222 may form for example a left side and a right side, a front side and a back side or the like, wherein these designations are chosen merely by way of example and are variable on the basis of an alteration of the position of the MEMS sensor 10 in space.

The sensor package 12 has a first opening 241 and a second opening 242, wherein the opening 241 connects the first partial volume 16 to an external environment 26 of the MEMS sensor in an acoustically transparent fashion. The opening 242 connects and/or fluidically couples the second partial volume 18 to the external environment 26 in an acoustically transparent fashion. In accordance with one exemplary embodiment, the openings 241 and 242 are non-closed and non-blocked openings in the sensor package 12. Further exemplary embodiments provide MEMS sensors in which an acoustically transparent material is arranged in the first and/or second opening, wherein acoustically transparent should be understood to mean that a sound damping of at most 3 dB(A), at most 2.5 dB(A) or at most 2 dB(A) is obtained.

The MEMS sensor can be used in accordance with one possibility of its use such that it detects a pressure or a pressure variation in the first partial volume 16 or the second partial volume 18 by virtue of the fact that the pressure or the pressure variation leads to a deflection of the membrane 14. Particularly in the field of dynamic deflection, for instance for detecting sound or in use in the context of photoacoustic sensors, the sensitivity and/or the frequency response of the membrane 14 can be influenced or determined by a pressure and/or a variable in the opposite partial volume 18 or 16, respectively. The fluidic and acoustically transparent coupling of this partial volume used as a back volume to the external environment can make it possible to the use MEMS sensor 10 in a system package whose internal volume then concomitantly influences the back volume, such that the resulting frequency response of the membrane 14 including a corresponding cut-off frequency is determined by the system volume. This makes it possible to set the frequency properties of the MEMS sensor 10 on the basis of the system package, such that an application-specific adaptation to different system packages is simplified or can be entirely obviated.

The acoustic short circuit possibly existing between the first partial volume 16 and the second partial volume 18 can be rectified or eliminated in a later use by incorporation in a system package by virtue of the fact that the system package implements a separation between the exterior region, which is fluidically coupled to the membrane 14, and the interior of the system volume.

Figure 2:
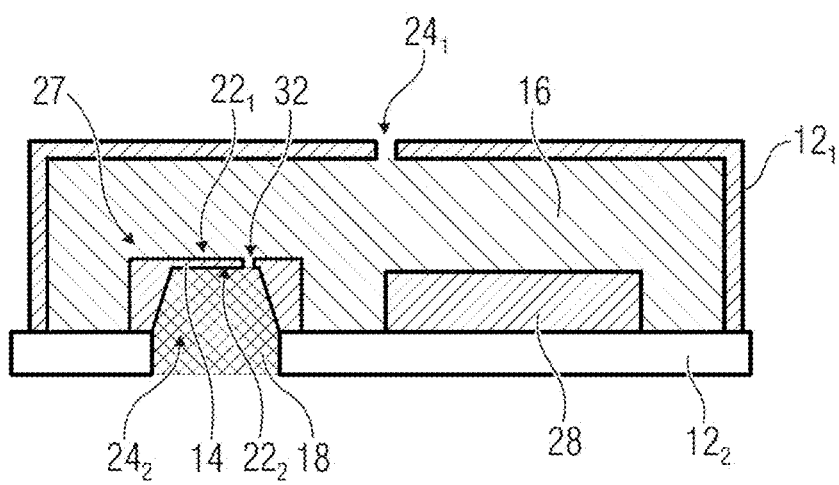
FIG. 2 shows a schematic lateral sectional view of a MEMS sensor in accordance with one exemplary embodiment, comprising a multipartite MEMS package.

FIG. 2 shows a schematic lateral sectional view of a MEMS sensor 20 in accordance with one exemplary embodiment, wherein the package is formed by two package parts 121 and 122. By way of example, the package part 122 can comprise a printed circuit board (PCB), which carries for example the microphone structure 27 comprising the membrane 14 and/or an application specific integrated circuit (ASIC) or evaluation device 28, which evaluates the membrane 14. The package part 121 can for example comprise or provide a protective package which is also referred to as a lid in the technical jargon. The lid can provide protection during processing or production of the MEMS sensor 20 and in this respect provide a synergistic dual use by also enabling the fluidic coupling to the system volume over and above the protection function. The evaluation device 28 can be configured to obtain a deflection signal from the membrane 14, said deflection signal having information about a deflection of the membrane 14. The evaluation device (ASIC) can be configured to provide a processed output signal on the basis of a processing of the deflection signal, wherein the evaluation device can be arranged within the sensor package 12.

The membrane 14 can have one or more ventilation holes 32 providing a fluidic coupling between the partial volumes 16 and 18, although this is effected under the influence of a fluidic resistance, that is to say that the ventilation openings 32 are acoustically at least partly nontransparent, such that a pressure variation in the partial volume 16 or 18 leads to a deflection of the membrane 14. Ventilation holes 32 in the membrane 14 can be used for pressure equalization between the sides of the membrane 14. Although the membrane opening fluidically couples the first partial volume 16 and the second partial volume 18 to one another, this coupling can be acoustically at least partly nontransparent. By way of example, the coupling by the membrane opening can act as a low-pass filter for a pressure change in the partial volume 16 and/or 18.

Figure 3:
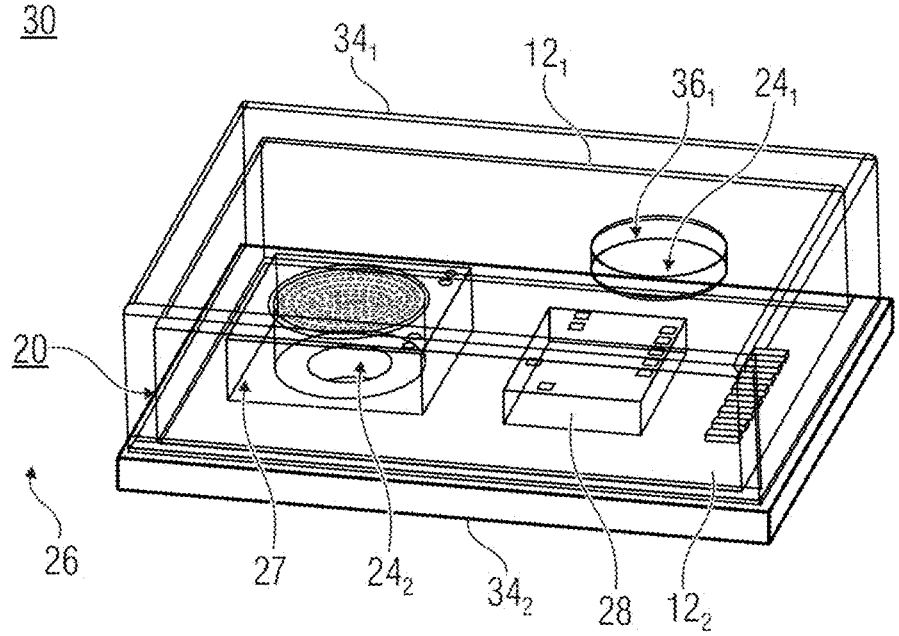
FIG. 3 shows a schematic perspective view of a MEMS sensor system in accordance with one exemplary embodiment.

FIG. 3 shows a schematic perspective view of a MEMS sensor system 30, which comprises the MEMS sensor 20, for example, and which furthermore comprises a system package 34 enclosing the MEMS sensor 20, wherein the package 34 can be formed in an integral or multipartite fashion. By way of example, the package 34 likewise comprises a package lid 341 jointly enclosing the MEMS sensor 20 arranged on a package part 342, wherein the package part 342 can likewise comprise a circuit board having for example circuit structures for electrically contacting the MEMS sensor 20. The package part 342 can have an opening, which at least partially corresponds to the opening 242, in order to provide a fluidic coupling between the microphone structure 27 and the external environment 26. Optionally, the package 34 can have an opening 361, which furthermore optionally can at least partly correspond to the opening 241, thereby enabling a fluidic coupling between the membrane 14 through the openings 241 and 361 with a volume located behind the latter, which can for example also be provided by the external environment 26. In this case, an acoustic short circuit can already be prevented, for instance if propagation time differences through the openings 242 and 241 have a difference such that they are evaluatable. That is to say that the system package 34 can be configured to avoid a fluidic short circuit between the openings 241 and 242.

Figure 4:
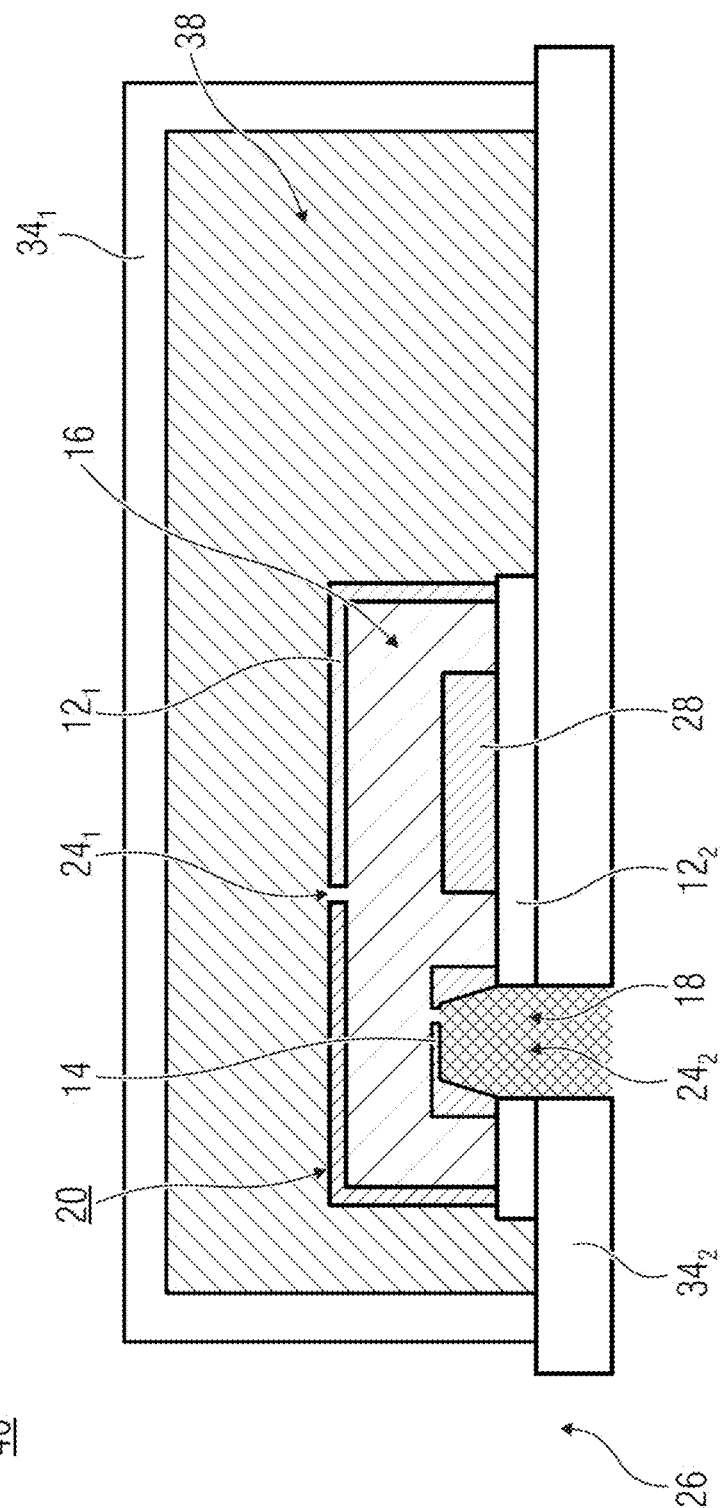
FIG. 4 shows a schematic lateral sectional view of a MEMS sensor system in accordance with one exemplary embodiment comprising a multipartite package.

FIG. 4 shows a schematic lateral sectional view of a MEMS sensor system 40 in accordance with one exemplary embodiment. The system package 34 comprising the package parts 341 and 342, together with the MEMS sensor 20, can provide an additional volume or a back volume extension, wherein the combination of the volumes 16 and 38 combinatorially influences or sets a frequency response of the membrane 14 vis a vis a pressure variation at the opening 242 or in the partial volume 18. The joint effect of the volumes 16 and 38 makes it possible to set, to adapt or to compensate for a property of the partial volume 16, said property possibly being regarded as a presetting, by a corresponding adaptation of the partial volume 38. The volume 38 can be designed for this purpose, for instance as content or shape of a package, for which reason the volume 38 can also be referred to as system volume. This makes possible an unchanged production of the partial volume 16 for different additional volumes or system volumes 38, wherein, during a process for producing the MEMS sensor system 40, the configuration of the package 34 can be adapted or embodied such that a desired frequency response of the membrane 14 is obtained. However, this can be effected independently of production and/or design of the MEMS sensor 20.

The system volume 38 described can be used here to set and, if appropriate, to alter the corresponding reference pressure. That is to say that, by way of the system volume, a variable pressure may be able to be applied to the membrane 14, for instance by way of the partial volume 16.

Although the MEMS sensor systems 30 and 40 are described such that they comprise the MEMS sensor 20, the MEMS sensor 10 can alternatively or additionally be arranged as well.

In a manner influenced by the arrangement of the MEMS sensor 20 in the system volume 34, the partial volume 18 can provide a pressure access opening or sound access opening (sound port), which is designated for example as bottom sound port. By contrast, the opening 241 can be designated as top sound port, wherein the terms "bottom/top" are arbitrarily changeable or interchangeable.

In this case, an electronic data processing of the MEMS sensor system 40 can be based on an electrically detected deflection signal which reproduces the deflection of the membrane 14 and which can be received by the ASIC 28. The ASIC 28 can carry out a preprocessing of the deflection signal and provide a preprocessed deflection signal via the circuit structures of the package part 122, which, without being processed or with further processing via circuit structures of the package part 342, are provided as sensor signal to the MEMS sensor system 40. That is to say that the MEMS sensor system can comprise a read-out circuit in the form of the circuit 122 which is configured to obtain and/or to provide a processed deflection signal which correlates with the deflection of the membrane 14 and which is obtained from the ASIC 28, for example. The MEMS sensor system comprises a system circuit, which can be integrated for example in the customized circuit of the system package, for instance in the package part 342, and which is electrically connected to the read-out circuit, that is to say circuit structures of the package part 122.

That is to say that a MEMS sensor in accordance with exemplary embodiments described herein can comprise a read-out circuit configured to obtain a processed deflection signal based on a deflection of the membrane 14, for instance by a corresponding signal being conducted from the ASIC to circuit structures in the package part 122. Furthermore, the MEMS sensor can be configured to provide a sensor signal, wherein the read-out circuit is electrically connectable to a system circuit. The system circuit can be formed for example at least partly as circuit structures in the package part 342.

Figure 5:
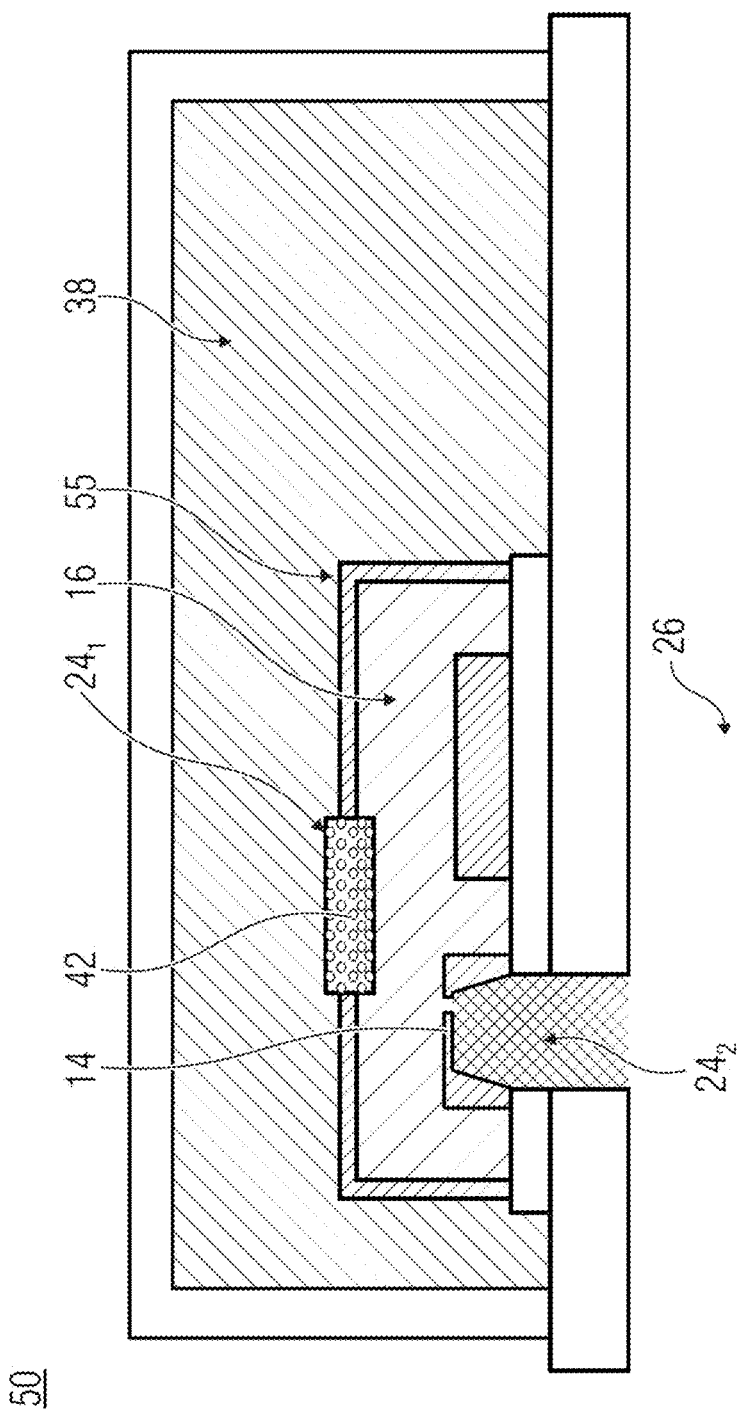
FIG. 5 shows a schematic lateral sectional view of a MEMS sensor system, wherein an acoustically transparent material is arranged in an opening.

FIG. 5 shows a schematic lateral sectional view of a MEMS sensor system 50, wherein an acoustically transparent material 42 is arranged in the opening 241. Alternatively or additionally, the acoustically transparent material 42 can also be arranged in the opening 242. The acoustically transparent material has a signal damping or a sound damping or sound reduction of at most 3 dB(A), at most 2.5 dB(A) or at most 2 dB(A). The acoustically transparent material 42 is suitable, for example, for restricting or preventing the entrance of particles and/or moisture or wetness through the opening 241 and/or 242 and in this respect enables a protection function for the membrane 14. The MEMS sensor system 50 comprises a MEMS sensor 55 comprising the acoustically transparent material 42 in the opening 241.

The acoustically transparent material 42 can be acoustically coupled, that is to say that it can be located in an acoustically relevant region of the MEMS sensor system 50 or of the MEMS sensor 55. This is achieved for example by the acoustically transparent material 42 fluidically coupling the partial volume 16 to the volume extension, i.e. the system volume 38, and/or by the acoustically transparent material 42 fluidically coupling the volume 422 to the external environment 26.

The acoustically transparent material 42 can for example be formed in a porous fashion and thus provide a mechanical barrier to wetness, moisture and/or particles, while a low or negligible acoustic influencing of the MEMS is obtained. Alternatively, a predefined influencing can also be effected, such that on the basis of the acoustically transparent material an acoustic adaptation is obtained in addition to the mechanical protection. That is to say that although the acoustically transparent material 42 preferably has a small influence on the acoustic coupling between the partial volume 16 and the system volume 38, in accordance with other preferred embodiments it can also provide a setting of an acoustic coupling between the adjacent partial volume and the external environment. In particular, such an acoustically transparent material can be configured in a porous fashion that specifically can allow soundwaves to pass, but can adapt the latter to a frequency response of the membrane 14. Various materials which absorb specific frequency ranges, or absorb them to a lesser extent or damp them, can be used for this purpose.

Figure 6:
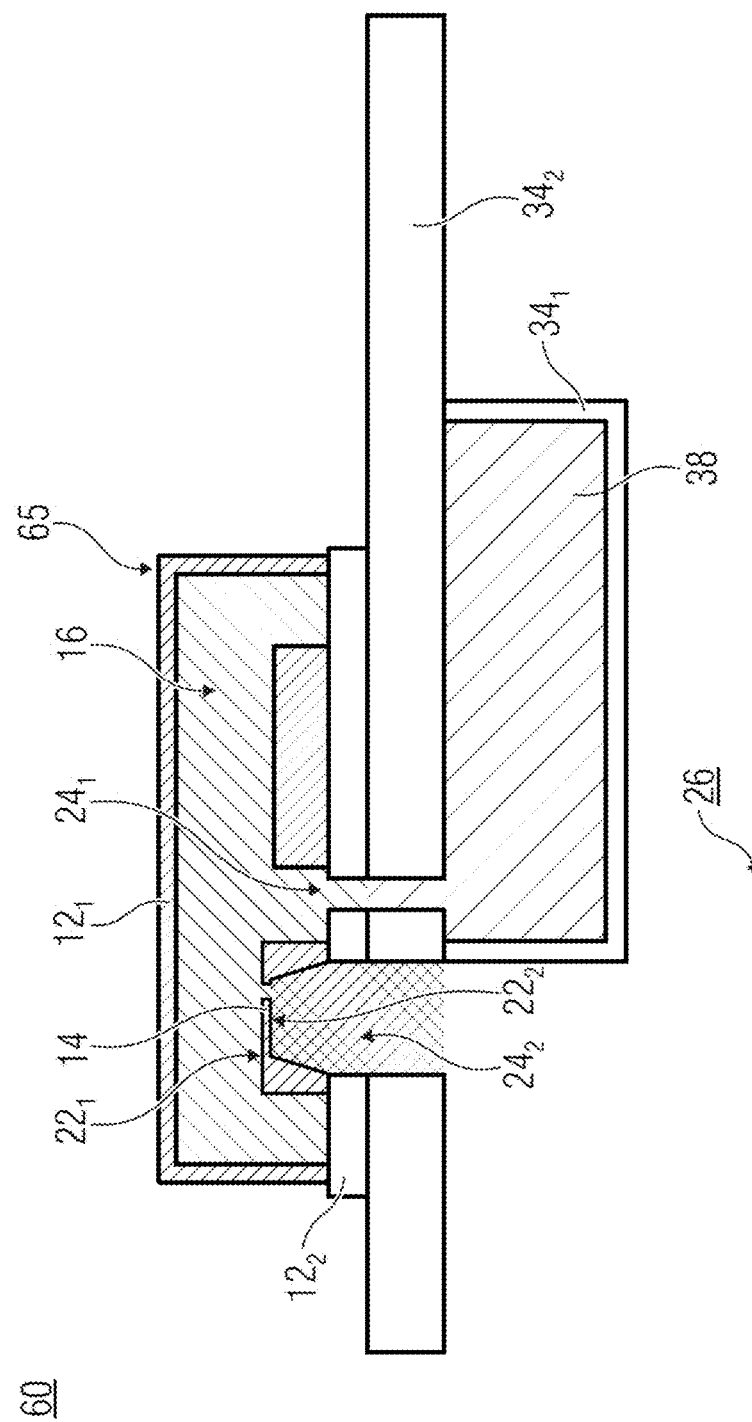
FIG. 6 shows a schematic lateral sectional view of a MEMS sensor system in accordance with a further exemplary embodiment, comprising a MEMS sensor in accordance with one exemplary embodiment, wherein a system volume is arranged on a different side than in FIG. 5.

FIG. 6 shows a schematic lateral sectional view of a MEMS sensor system 60 in accordance with a further exemplary embodiment, which comprises a MEMS sensor 65 in accordance with one exemplary embodiment. The MEMS sensor 65 is embodied such that the openings 241 and 242 are arranged on the same side of the package 12, for example in the package part 122, wherein each of the openings 241 and 242 can be arranged at an arbitrary package side of the package 12 independently of one another.

The system volume 38 can be arranged such that, in contrast to what is illustrated in FIG. 2, for example, it does not enclose the package part 121, rather the package part 341 is arranged at an opposite side of the package part 342 with respect to the MEMS sensor 65. The fluidic coupling of the partial volume 16 to the system volume 38 can thus be effected by a correspondence in the opening 241 to an opening in the package part 342.

The exemplary embodiments described herein relate to adapting the back volume for a membrane, for instance the membrane 14 by a back volume extension, that is to say the system volume. In accordance with exemplary embodiments, the combinatorial volume to be set can be arranged either on the first side 221 or on the second side 222 of the membrane 14. On the basis thereof, either the first opening 241 or the second opening 242 can be coupled to the system volume 38 and the other opening can be fluidically coupled to the environment 26. In both cases the system volume can set a resonant frequency of the membrane 14 for fluid sound in the environment 26 of the MEMS sensor system 60. The setting can be effected by way of the membrane deflection, for instance by a pressure in the system volume 38 and/or the partial volume 16 and/or by a volume content, that is to say a physical extent, of the combinatorial volume and/or of the individual volumes 16 and/or 38. Although the system volume 38 is illustrated as a single volume, it is likewise possible to simplify the system volume 38 into a plurality of partial volumes.

Figure 7:
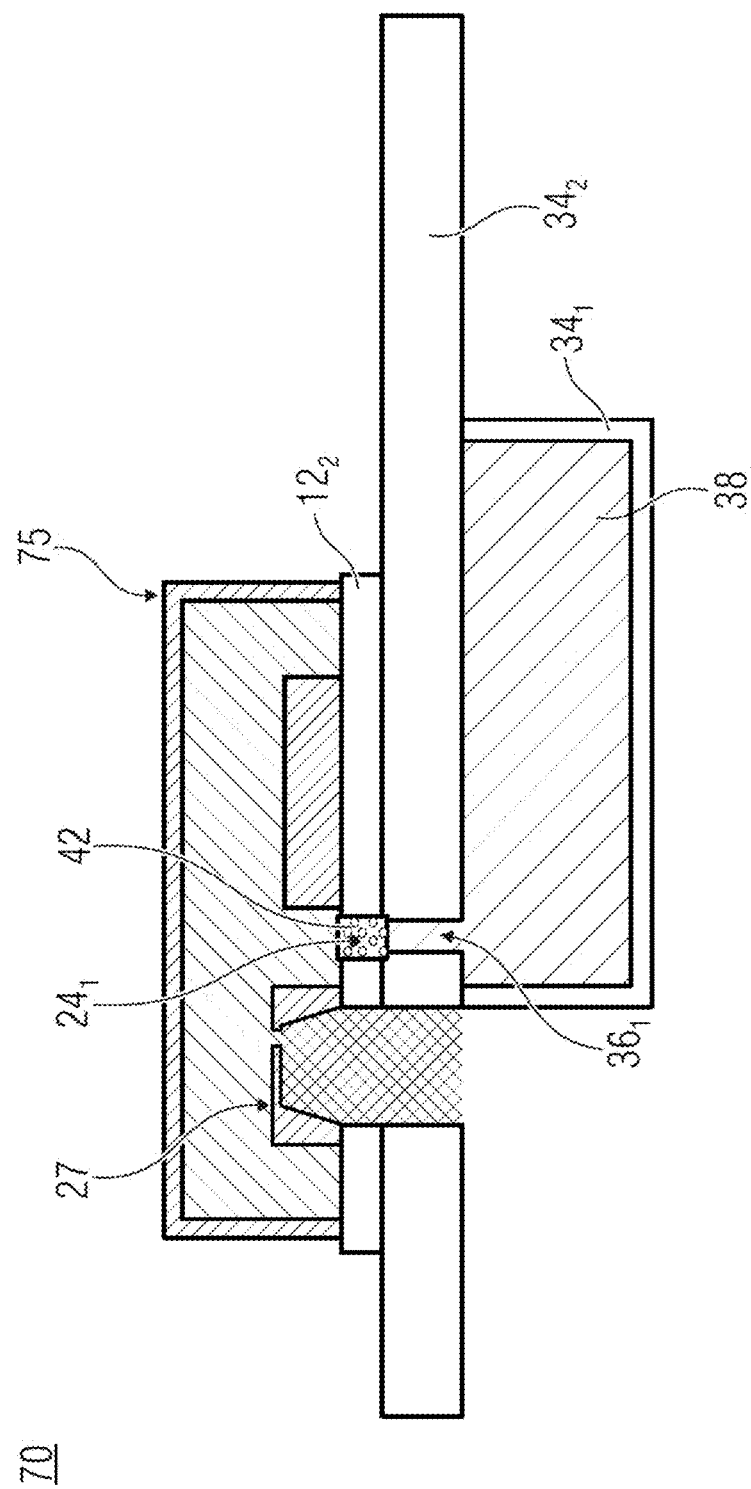
FIG. 7 shows a schematic lateral sectional view of a MEMS sensor system comprising a MEMS sensor in accordance with one exemplary embodiment, which MEMS sensor, compared with the MEMS sensor from FIG. 6, comprises the acoustically transparent material in the opening.

FIG. 7 shows a schematic lateral sectional view of a MEMS sensor system 70 comprising a MEMS sensor 75 in accordance with one exemplary embodiment, which MEMS sensor, compared with the MEMS sensor 65 from FIG. 6, comprises the acoustically transparent material 42 in the opening 241. Alternatively or additionally, the acoustically transparent material 42 can also be arranged in a corresponding opening, for instance the opening 361, in the system package.

In MEMS sensors in accordance with exemplary embodiments described herein, an evaluation circuit, for instance the ASIC 28, can be covered with a light-nontransparent material, which is also referred to as glob top. This enables the optical shielding and/or mechanical protection of the ASIC 28.

The ASIC and the membrane structure can be arranged on a common carrier, for instance a printed circuit board (PCB), which enables a simple evaluation of the circuit.

Exemplary embodiments are directed to combining microphone structures embodied as a so-called "top port configuration", that is to say a hole in the lid, and so-called "bottom port configurations" (hole in the PCB). This makes it possible use the package 12 as a standard lid. Furthermore, it enables the PCB to be used as a standard PCB, in particular as a standard carrier for the MEMS microphone. Compared with known production concepts, this enables an unchanged production sequence. By extending the partial volume 16 and/or 18 by the system volume 38, it is possible to reduce the cut-off frequency of the membrane 14. Alternatively or additionally, the frequency range of the microphone can be extended.

Exemplary embodiments make it possible to use conventional MEMS-based microphones as ultra-sensitive differential pressure sensors since the frequency response is adaptable. Exemplary embodiments enable in particular a fine adjustment of the lower cut-off frequency during the use of the MEMS sensor in the field. As a result of the possibility of setting the frequency response, a plug-and-play function of the modules can be obtained. Exemplary embodiments enable use or installation of pretested components complying with quality criteria in the continuing manufacturing or assembly process.

A further positive aspect of exemplary embodiments described herein will be explained with reference to the subsequent FIGS. 8a, 8b and 8c.

Figure 8A:
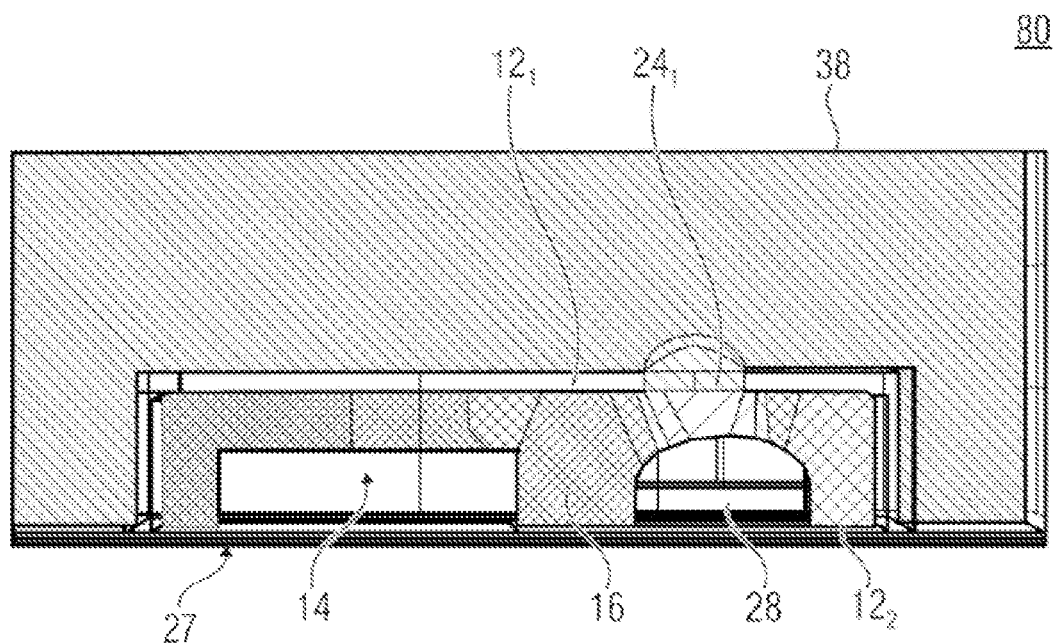
FIG. 8a shows a schematic lateral sectional view of pressure profiles in a MEMS sensor system in accordance with one exemplary embodiment.

FIG. 8a shows pressure profiles in a MEMS sensor system 80 in a schematic lateral sectional view. Forming the back volume by the partial volume 16 in combination with the system volume 38, with the housing 12 being arranged therebetween, results in cooling being provided for the membrane 14, which is advantageous. As a result of the comparatively small volume of the partial volume 16, in the event of a movement of the membrane 14, a comparatively high pressure is generated in the partial volume 16. This pressure can lead to a temperature gradient in the partial volume 16, as is illustrated with reference to FIG. 8a, where the opening 241 is arranged adjacent to the ASIC 28. In accordance with alternative exemplary embodiments, the opening 241 can also be arranged adjacent to the membrane 14 or at a different location. The temperature in the partial volume 16 can decrease toward the opening 241. The membrane can be deflected as a result of a corresponding pressure change. The compression obtained in one or both partial volumes can lead to heating thereof. The second opening 221 can be configured to at least partly reduce the heating. The system volume 38 can have a comparatively lower temperature value, such that the package 12 can act as a heat sink for the partial volume 16.

Figure 8B:
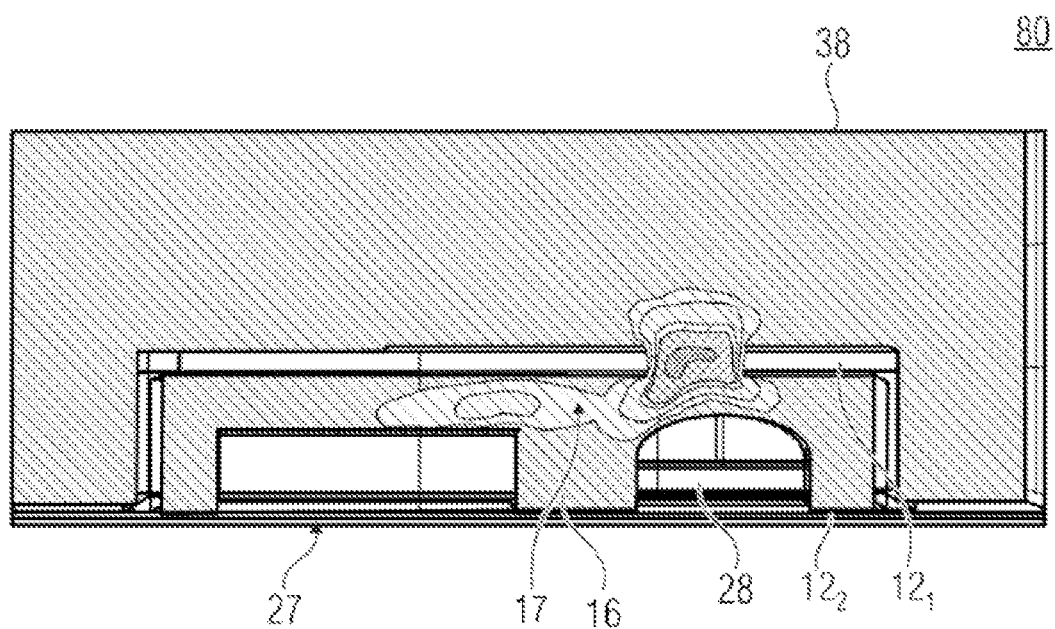
FIG. 8b shows a schematic lateral sectional view of the MEMS sensor system from FIG. 8a, wherein the velocity of the fluid in the partial volume is illustrated.

FIG. 8b shows a schematic lateral sectional view of the MEMS sensor system 80, wherein the velocity of the fluid 17 in the partial volume 16 and also the system volume 38 is illustrated. The velocity is increased in the region of the opening 241 compared with other locations in the partial volume 16 and the system volume 38.

Figure 8C:
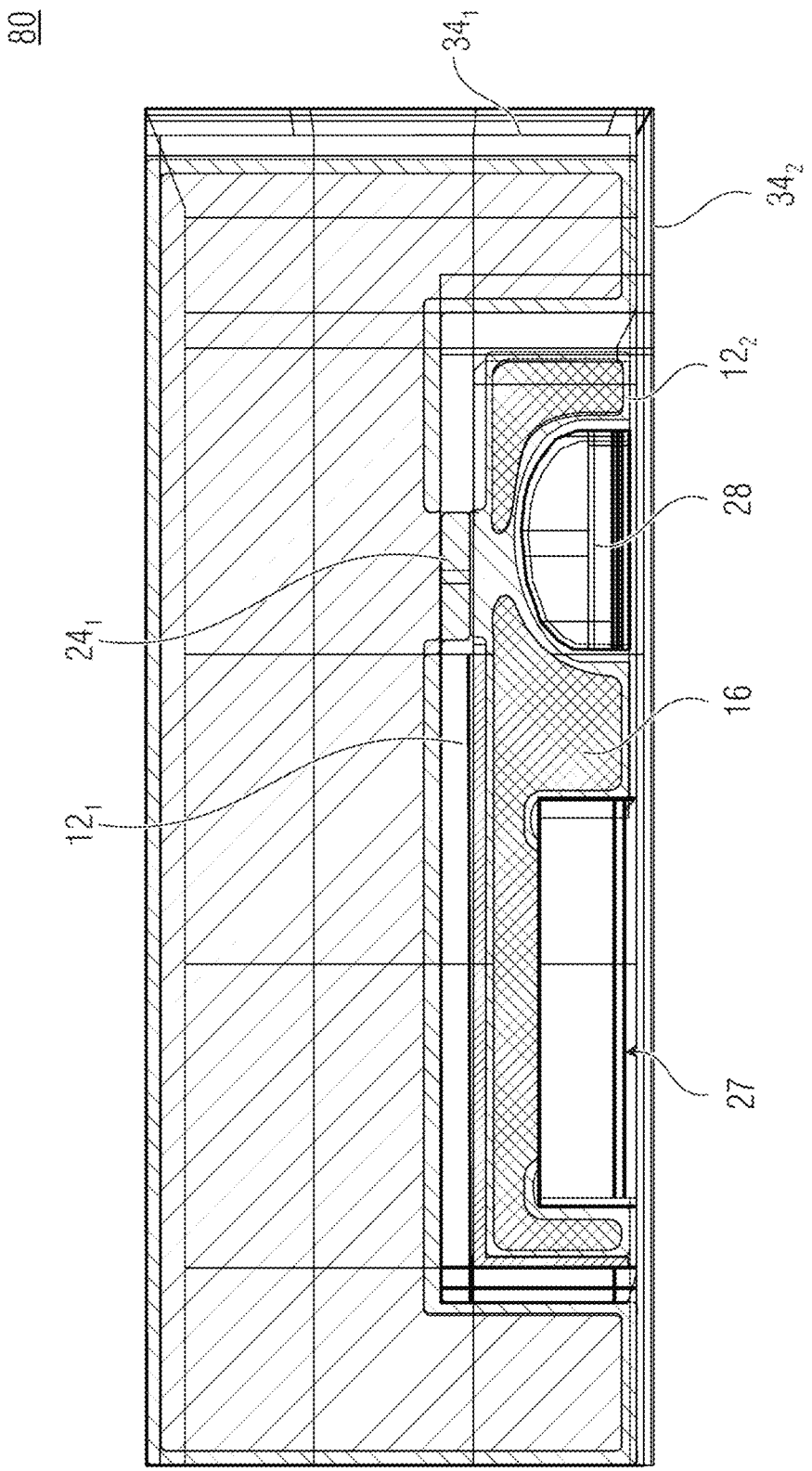
FIG. 8c shows a schematic lateral sectional view of the MEMS sensor system from FIG. 8a, wherein a heating of the package structures is illustrated.

FIG. 8c shows a schematic lateral sectional view of the MEMS sensor system 80, wherein heating of the package structures 121 and 341 is illustrated. It becomes clear that the package structures are likewise heated as a result of the heating of the partial volume 16, wherein the thermal energy emitted in the direction thereof is dissipated from the partial volume 16. FIG. 8c likewise shows that the package 121 can cool there directly adjoining fluid in the partial volume 16, which can result in an improved behavior of the MEMS microphone.

With reference to FIGS. 9a and 9b, a schematic comparison is made between a bottom port microphone (FIG. 9a) and a dual port microphone in accordance with exemplary embodiments described herein (FIG. 9b). As a result of the additional sound port, that is to say the combination with the system volume 38, a lower range 48 of the frequency response is raised slightly, just like a medium range 52. The cut-off frequency in the upper frequency range 54 is reduced, however, which constitutes a design parameter.

With reference to FIG. 10, a description is given of a MEMS sensor 100 in accordance with one exemplary embodiment, which can be arranged as an alternative or in addition to the other MEMS sensors described herein in MEMS sensor systems.

In this case, FIG. 10 shows a schematic lateral sectional view of the MEMS sensor 100. The MEMS sensor 100 comprises the sensor package 12 and the membrane 14 arranged in the sensor package, as described for example for the MEMS sensor 10. As a result of the arrangement of the membrane 14, the volume in the sensor package 12 is divided such that at least the first partial volume 16 and the second partial volume 18 arise, which adjoin different main sides 221 and 222 of the membrane 14. As likewise described for the MEMS sensor 10, the sensor package 12 has openings 241 and 242. Compared with the MEMS sensor 10, one opening is indeed configured in an acoustically transparent fashion, such that for example the partial volume 16, alternatively the partial volume 18, is connected to the external environment 26 of the sensor package 12. However, the second opening 222, which extends for example to the partial volume 18 or partial volume 16, respectively, is provided with an elastic element 44 arranged in the opening 242. The elastic element 44 is configured, on the basis of a fluid pressure in the external environment 38 and/or in the system volume of the MEMS sensor system if a corresponding integration is effected, to alter the content of the partial volume 18, as is indicated by the hatched area 46. The elastic element 44 can be configured in a fluidically tight fashion. That is to say that a pressure in the external environment 26 and/or in the system volume 38 can result in the elastic element 44 being deflected, such that the partial volume 16 in the interior of the sensor package 12 is variable, for example is reduced or alternatively enlarged.

This enables the adaptation of the frequency response of the membrane 14 by a pressure prevailing in the corresponding partial volume, which is possible as an alternative or in addition to altering the volume.

In accordance with one advantageous embodiment, a MEMS sensor system comprises a control unit configured to evaluate a propagation time difference of an acoustic signal between the first opening and the second opening, and, using a deflection signal based on a deflection of the membrane 14 or on the basis of a signal derived therefrom, for instance by signal processing, to provide active sound suppression with respect to the deflection signal. In this regard, by way of example, propagation time differences of a sound wave through the opening 221 compared with a propagation time through the opening 222 can result in an equal or identical sound pattern impinging on the membrane 14 at different points in time, such that the membrane 14 is influenced in a time-staggered manner. This influencing can be evaluated in the membrane 14. Alternatively, it is likewise possible to evaluate the corresponding individual signal profiles for example in the openings 221 and 222. This can be done for example by way of the arrangement of a first and a second membrane. A MEMS sensor system can comprise a read-out circuit, which can be integrated for example in the package part 122 formed as a circuit. The read-out circuit can be configured to obtain and/or to provide a processed deflection signal that correlates with the deflection of the membrane 14. For this purpose, circuit structures of the package part 122 can be connected to the ASIC, for example. The arrangement of the elastic element is combinable with the other exemplary embodiment described herein. In this regard, by way of example, the MEMS sensor 10, 20, 40, 55 and/or 65 and/or 75 can be equipped with an elastic element of this type.

FIG. 11 shows a schematic lateral sectional view of a MEMS sensor system 110, wherein the MEMS sensor 100 is arranged in the system package 34. The MEMS sensor system 110 comprises a pressure control device 56 for controlling the fluid pressure P in the system volume 38. The pressure P can be controlled on the basis of specification information that correlates with a frequency response to be set of the membrane 14. This can involve for example a table (lookup table) and/or a specified value of a pressure that is to be set in the system volume 38 and/or the partial volume 16. The pressure control device 56 can be configured to set the fluid pressure P in the system volume 38 and/or the partial volume 16 on the basis thereof. The pressure regulator 56 can comprise an actuator, e.g. a pump, which is coupled to a fluid reservoir, e.g. a separately provided volume or an environment of the device, for instance in order to guide the fluid from the reservoir to system volume 38 and/or the partial volume 16 in order to increase the pressure P. Alternatively or additionally, the pressure regulator 56 can be configured to discharge fluid from the system volume 38 and/or the partial volume 16 in order to reduce the pressure P. Alternatively or additionally, the pressure regulator 56 can be configured to control the pressure on the basis of a thermal expansion of the fluid. For this purpose, the pressure regulator 56 can comprise e.g. a heating element such as an infrared heater, for instance, in order, by generating or providing thermal energy, to generate a volume expansion and a pressure increase, wherein a decrease in the heating power may be usable for a pressure reduction.

MEMS sensors in accordance with exemplary embodiments described herein can furthermore comprise an optical and/or thermal emitter, such that the MEMS sensor is formed as a photoacoustic gas sensor. Photoacoustic gas sensors of this type, just like MEMS microphones, can use a deflectable membrane to be deflected on the basis of an interaction between the emitted thermal radiation and a gas in the partial volume 16 and/or 18, wherein this deflection allows conclusions to be drawn about a gas between the optical and/or thermal emitter and the membrane 14.

FIG. 12 shows a schematic flow diagram of a method 1200 for producing a MEMS sensor system, for example a MEMS sensor system in accordance with exemplary embodiments described herein. The method 1200 comprises a step 1210 involving arranging a membrane in a system volume of a MEMS sensor system, such that the membrane is arranged between a first partial volume of the MEMS sensor system and a second partial volume of the MEMS sensor system. The second partial volume is configured such that a frequency response of the membrane responding to a pressure change in a system environment that is fluidically coupled to the first partial volume is adapted to a target specification. In this case, the frequency response includes the cut-off frequency. The latter can be set typically in a range of at least 1 Hz and at most 200 Hz, at least 1.5 Hz and at most 150 Hz or at least 2 Hz and at most 90 Hz.

The method 1200 can implemented such that the membrane is provided as a differential pressure sensor formed in the absence of a package, wherein arranging the membrane comprises integrating the differential pressure sensor into the system volume.

That is to say that, referring once again to FIG. 2, for example, the MEMS sensor is formed in the absence of the sensor package in order directly to enable the corresponding MEMS sensor to be integrated into the system volume 38. The lid, that is to say the sensor package 12 or the package part 121, can be provided for example for preventing mechanical damage to the membrane 14 during production and/or transport of the MEMS sensor. If a corresponding protection task is avoidable or if the requirement is not made, then an arrangement of the lid can be dispensed with on the basis of the adaptation of the frequency response by the system volume 38.

MEMS sensors and MEMS sensor systems enable simple and robust processing and/or corresponding transport of the MEMS sensors. In accordance with exemplary embodiments, applying a chip (MEMS sensor) on a system chip or carrier, which is also referred to as a DIE bonding process, can be avoided since the latter can be effected directly during the manufacture of the MEMS sensor system, for example a cellular phone or the like, and can thus be omitted during the production of the MEMS sensor. Identically formed MEMS sensors can be used for a high number of different MEMS sensor systems since an adaptation to the respective area of tasks can be carried out by the system volume. This also enables a fast production process. For end users this affords the advantage of defining the frequency response of the membrane 14, in particular the cut-off frequency, themselves by correspondingly adapting the system volume. In this case, the absolute pressure and/or the ambient pressure can correlate with the system volume. This also enables additional sensor possibilities, for example an absolute pressure sensor as second membrane arranged on the external package. These possibilities can be integrated whilst maintaining existing layouts. In accordance with examples, it is possible to use a completely identical geometry and/or an unchanged connection routing (Pinout). The signal can nevertheless be varied in terms of its characteristic.

Although some aspects have been described in association with a device, it goes without saying that these aspects also constitute a description of the corresponding method, and so a block or a component of a device should also be understood as a corresponding method step or as a feature of a method step. Analogously thereto, aspects that have been described in association with or as a method step also constitute a description of a corresponding block or detail or feature of a corresponding device.

In some exemplary embodiments, a programmable logic component (for example a field programmable gate array, an FPGA) can be used to carry out some or all functionalities of the methods described herein. In some exemplary embodiments, a field programmable gate array can interact with a microprocessor in order to carry out one of the methods described herein. Generally, in some exemplary embodiments, the methods are carried out on the part of an arbitrary hardware device. The latter can be universally usable hardware such as a computer processor (CPU) or hardware specific to the method, such as an ASIC, for example.

The exemplary embodiments described above merely constitute an illustration of the principles of the present invention. It goes without saying that modifications and variations of the arrangements and details described herein will be apparent to others skilled in the art. Therefore, the intention is for the invention to be restricted only by the scope of protection of the following patent claims, and not by the specific details that have been presented on the basis of the description and the explanation of the exemplary embodiments herein.

What is claimed is:

1. A MEMS sensor comprising:
a sensor package;
a membrane arranged in the sensor package, wherein a first partial volume of the sensor package adjoins a first main side of the membrane and a second partial volume of the sensor package adjoins a second main side of the membrane, wherein the second main side is arranged opposite the first main side;
a first opening in the sensor package, said first opening connecting the first partial volume to an external environment of the sensor package in an acoustically transparent fashion, and
a second opening in the sensor package, said second opening connecting the second partial volume to the external environment of the sensor package in an acoustically transparent fashion.

2. The MEMS sensor as claimed in claim 1, which is configured to be integrated into a MEMS sensor system whilst avoiding a fluidic short circuit between the first opening and the second opening.

3. The MEMS sensor as claimed in claim 1, comprising an acoustically transparent material arranged in the first and/or second opening and having a signal damping of at most 3 dB(A).

4. The MEMS sensor as claimed in claim 3, wherein the acoustically transparent material is acoustically coupled.

5. The MEMS sensor as claimed in claim 3, wherein the acoustically transparent material is formed in a porous fashion.

6. The MEMS sensor as claimed in claim 3, wherein the acoustically transparent material provides a water-tightness and/or an obstacle to the passage of particles for the first partial volume or the second partial volume.

7. The MEMS sensor as claimed in claim 3, wherein the acoustically transparent material provides a setting of an acoustic coupling between the adjacent partial volume and the external environment.

8. The MEMS sensor as claimed in claim 1, wherein the second partial volume is heatable by a pressure change, wherein the second opening is configured to at least partly reduce the heating.

9. The MEMS sensor as claimed in claim 1, which is formed as a MEMS sound transducer.

10. The MEMS sensor as claimed in claim 1, comprising an elastic element, which is arranged either in the first opening or in the second opening and is configured to alter a content of the first or second partial volume on the basis of a fluid pressure in the external environment.

11. The MEMS sensor as claimed in claim 1, wherein the membrane has at least one membrane opening which fluidically couples the first partial volume and the second partial volume to one another, wherein a coupling by the membrane opening acts as a low-pass filter for a pressure change in the first partial volume and/or second partial volume.

12. The MEMS sensor as claimed in claim 1, comprising an evaluation device configured to obtain a deflection signal from the membrane, said deflection signal having information about a deflection of the membrane, and to provide a processed deflection signal on the basis of a processing of the deflection signal, wherein the evaluation device is arranged within the sensor package.

13. The MEMS sensor as claimed in claim 1, comprising a read-out circuit configured to obtain a processed deflection signal based on a deflection of the membrane and to provide a sensor signal, wherein the read-out circuit is electrically connectable to a system circuit.

14. The MEMS sensor as claimed in claim 1, which comprises an optical emitter and is formed as a photoacoustic gas sensor.

15. A MEMS sensor comprising:
a sensor package;
a membrane arranged in the sensor package, wherein a first partial volume of the sensor package adjoins a first main side of the membrane and a second partial volume of the sensor package adjoins a second main side of the membrane, wherein the second main side is arranged opposite the first main side;
a first opening in the sensor package, said first opening connecting the first partial volume to an external environment of the sensor package in an acoustically transparent fashion;
a second opening in the sensor package, said second opening adjoining the second partial volume; and
an elastic element, which is arranged in the second opening and is configured to alter a content of the second partial volume on the basis of a fluid pressure in the external environment.

16. A MEMS sensor system comprising:
a system package having a system volume; and
a MEMS sensor comprising:
a sensor package;
a membrane arranged in the sensor package, wherein a first partial volume of the sensor package adjoins a first main side of the membrane and a second partial volume of the sensor package adjoins a second main side of the membrane, wherein the second main side is arranged opposite the first main side;
a first opening in the sensor package, said first opening connecting the first partial volume to an external environment of the sensor package in an acoustically transparent fashion;
a second opening in the sensor package, said second opening adjoining the second partial volume; and
an elastic element, which is arranged in the second opening and is configured to alter a content of the second partial volume on the basis of a fluid pressure in the external environment,
wherein the system volume is coupled to the first partial volume either via the first opening or via the second opening, wherein the MEMS sensor is fluidically coupled to an environment of the MEMS sensor system via the other opening of the first and second openings, and
wherein the system volume sets a resonant frequency of the membrane for fluid sound in the environment of the MEMS sensor system.

17. The MEMS sensor system as claimed in claim 16, comprising a read-out circuit configured to obtain and/or to provide a processed deflection signal which correlates with a deflection of the membrane,
wherein the MEMS sensor system comprises a system circuit, which is electrically connected to the read-out circuit.

18. The MEMS sensor system as claimed in claim 16, wherein the system package is configured to avoid a fluidic short circuit between the first opening and the second opening.

19. The MEMS sensor system as claimed in claim 16, comprising a control unit configured to evaluate a propagation time difference of an acoustic signal between the first opening and the second opening and, using a deflection signal based on a deflection of the membrane or on the basis of a signal derived therefrom, to provide active sound suppression with respect to the deflection signal.

20. The MEMS sensor system as claimed in claim 16, comprising a porous material, arranged in the opening between the MEMS sensor and the system volume.

21. The MEMS sensor system as claimed in claim 16, comprising an elastic element, arranged either in the first opening or in the second opening such that the first partial volume or the second partial volume and the system volume are spaced apart from one another by the elastic element, wherein the elastic element is configured to influence a frequency response of the membrane on the basis of a fluid pressure in the system volume.

22. The MEMS sensor system as claimed in claim 21, comprising a pressure control device for controlling the fluid pressure in the system volume on the basis of specification information which correlates with a frequency response to be set of the membrane.

23. The MEMS sensor system as claimed in claim 16, which is embodied as a mobile device.

24. A method for producing a MEMS sensor system, the method comprising:
arranging a membrane in a system volume of a MEMS sensor system, such that the membrane is arranged between a first partial volume of the MEMS sensor system and a second partial volume of the MEMS sensor system, wherein the second partial volume is configured such that a frequency response of the membrane responding to a pressure change in a system environment that is fluidically coupled to the first partial volume is adapted to a target specification;
providing a first opening in a MEMS sensor system package, said first opening connecting the first partial volume to an external environment of the MEMS sensor system package in an acoustically transparent fashion; and
providing a second opening in the MEMS sensor system package, said second opening connecting the second partial volume to the external environment of the MEMS sensor system package in an acoustically transparent fashion, wherein a projection of the first opening onto a plane of the membrane is laterally offset from a projection of the second opening onto the plane of the membrane.

25. The method as claimed in claim 24, wherein the membrane is provided as a differential pressure sensor formed in the absence of a sensor package, wherein arranging the membrane comprises integrating the differential pressure sensor into the system volume.

\* \* \* \* \*